United States Patent
Joo

(10) Patent No.: US 6,676,764 B2
(45) Date of Patent: Jan. 13, 2004

(54) METHOD FOR CLEANING A SUBSTRATE IN SELECTIVE EPITAXIAL GROWTH PROCESS

(75) Inventor: Sung Jae Joo, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 232 days.

(21) Appl. No.: 10/016,010

(22) Filed: Dec. 10, 2001

(65) Prior Publication Data

US 2002/0157688 A1 Oct. 31, 2002

(30) Foreign Application Priority Data

Apr. 30, 2001 (KR) .......................................... 2001-23399

(51) Int. Cl.[7] ................................................ B08B 7/04
(52) U.S. Cl. .............................. 134/2; 134/1.3; 134/19; 134/902; 438/906
(58) Field of Search ........................... 134/2, 3, 19, 31, 134/902, 37, 1.2, 1.3; 438/906

(56) References Cited

U.S. PATENT DOCUMENTS

| | | | | |
|---|---|---|---|---|
| 5,089,441 A | * | 2/1992 | Moslehi | 438/800 |
| 5,358,895 A | * | 10/1994 | Steele et al. | 117/84 |
| 5,378,651 A | * | 1/1995 | Agnello et al. | 438/489 |
| 5,403,434 A | * | 4/1995 | Moslehi | 134/1.2 |
| 5,441,012 A | * | 8/1995 | Aketagawa et al. | 117/86 |
| 5,899,752 A | * | 5/1999 | Hey et al. | 438/791 |
| 6,494,959 B1 | * | 12/2002 | Samoilov et al. | 134/2 |

OTHER PUBLICATIONS

Low Temperature Selective Epitaxial Growth of Silicon at Atmospheric Pressure, IBM TechnicalDisclosure Bulletin vol. 32, Issue 8B, pp. 280–281, Jan. 1990.*

Yamazaki et al, Investigation of Thermal Removal of Native Oxide from Si (100) Surfaces in Hydrigen for Low–Temperature Si CVD Epitaxy, J. Electrochemical Soc. vol. 139, No. 4, pp. 1175–1180, Apr. 1992.*

H. Koga, et al. "Two–Dimensional Borderless Contact Pad Technology for a $0.135\mu m^2$ 4–Gigabit DRAM Cell," *IEEE Proceedings*, (1997), pp. 2.1.1–2.1.4.

Y. Mitani, I. Mizushima, S. Kambayashi, H. Koyama, M.T. Takagi, and M. Kashiwagi; "Buried Source and Drain (BSD) Structure for Ultra–Shallow Junction using Selective Deposition of Highly Doped Amorphous Silicon"; *Symposium on VLSI Technology Digest of Technical Papers*, 1996, pp. 176–177.

Carlos Mazuré, Jon Fitch and Craig Gunderson; "Facet Engineered Elevated Source/Drain By Selective Si Epitaxy For 0.35 Micron Mosfets"; *IEEE Proceedings*, 1992; vol. 4 pp. 33.7.1–33.7.4.

Jie J. Sun and Carlton M. Osburn; "Impact of Epi Facets on Deep Submicron Elevated Source/Drain MOSFET Characteristics"; *IEEE Transactions on Electron Devices*; vol. 45. No. 6, 1998, pp. 1377–1380.

(List continued on next page.)

*Primary Examiner*—Alexander Markoff
(74) *Attorney, Agent, or Firm*—Ladas & Parry

(57) ABSTRACT

The present invention discloses a method for cleaning a surface of a substrate where a silicon epitaxial layer will be formed before growing the silicon epitaxial layer in a selective epitaxial growth process. Firstly, a high temperature heating element is aligned in a silicon epitaxial layer growth chamber, disposed separated from the substrate, a cleaning gas is inserted into the chamber and is decomposed into an atom or radical state having high reactivity in a gas phase according to heat generation of the high temperature heating element, and is diffused into the substrate, whereby a substrate cleaning reaction is performed at a substrate temperature ranging from 400 to 600° C.

10 Claims, 1 Drawing Sheet

OTHER PUBLICATIONS

Kiyotaka Miyano, Ichiro Mizushima, Kazuya Ohuchi, Akira Hokazono, and Yoshitaka Tsunashima; "Facet–Free Si Selective Epitaxial Growth Adaptable to Elevated Source/Drain MOSFETs with Narrow STI"; *Extended Abstracts of the 1998 International Conference on Solid State Devices and Materials Hiroshima*, 1998, pp. 420–421.

Jung Ho Lee, Kil Ho Lee, In Seok Yeo and Sahng Kyoo Lee; "Strained Growth Behavior of Selective Silicon Epitaxy in Confined Structures"; *Journal of the Korean Physical Society*, vol. 33, 1998, pp. S302–S304.

Tatsuya Ohguro, Keisaku Yamada, Naoharu Sugiyama, Seiji Imai, Kouji Usuda, Takashi Yoshitomi, Claudio Fiegna, Mizuki Ono, Masanobu Saito, Hisayo Sasaki Momose, Yasuhiro Katsumata, and Hiroshi Iwai; "0.15–$\mu$m Buried–Channel p–MOSFET's with Ultrathin Boron–Doped Epitaxial Si Layer"; *IEEE Transactions on Electron Devices*, vol. 45, No. 3; 1998, pp. 717–721.

Tatsuya Ohguro, Naoharu, Sugiyama, Seiji Imai, Kouji Usuda, Masanobu Saito, Takashi Yoshitomi, Mizuki Ono, Hideki Kimijima, Hisayo Sasaki Momose, Yasuhiro Katsumata, and Hiroshi Iwai; "Updated Epitaxial Si Channel n–MOSFET Grown by UHV–CVD with Preheating"; *IEEE Transactions on Electron Devices*, vol. 45, No. 3, 1998, pp. 710–716.

Kenji Noda, Toru Tatsumi, Tetsuya Uchida, Ken Nakajima, Hidenobu Miyamato, and Chenming Hu; "A 0.1–$\mu$m Delta–Doped MOSFET Fabricated with Post–Low–Energy Implanting Selective Epitaxy"; *IEEE Transactions on Electron Devices*, vol. 45, No. 4, 1998, pp. 809–814.

J. Sun, R.F. Bartholomew, K. Bellur, A. Srivastava, C.M. Osburn, N.A. Masnari; "A Comparative Study of n+/p Junction Formation for Deep Submicron Elevated Source/Drain Metal Oxide Semiconductor Field Effect Transistors"; *J. Electrochem. Soc.*, vol. 144, No. 10, 1997, pp. 3659–3664.

Jie J. Sun, Robert F. Bartholomew, Kashyap Bellur, Anadi Srivastava, Carlton M. Osburn, and Nino A. Masnari; "The Effect of the Elevated Source/Drain Doping Profile on Performance and Reliability of Deep Submicron MOSFET's"; *IEEE Transactions on Electron Devices*, vol. 44, No. 9, 1997, 1491–1498.

Satoshi Yamakawa, Kohei Sugihara, Taisuke Furukawa, yasutaka Nishioka, Takumi Nakahata, Yuji Abe, Shigemitsu Maruno, and Yasunori Tokuda; "Drivability Improvement on Deep–Submicron MOSFET's by Elevation of Source/Drain Regions"; *IEEE Electron Device Letters*, vol. 20, No. 7, 1999, pp. 366–368.

H. Hada, T. Tatsumi, K. Miyanaga, S. Iwao, H. Mori and K. Koyama; "A Self–Aligned Contact Technology Using Anisotropical Selective Epitaxial Silicon For Giga–Bit DRAMs" *IEEE Proceedings*, 1995, pp. 27.4.1–27.4.4.

H. Koga, N. Kasai, H. Hada, T. Tatsumi, H. Mori, S. Iwao, K. Saino, H. Yamaguchi, K. Nakajima, Y. Yamada, K. Tokunaga, S. Hirasawa, K. Yoshida, A. Nishizawa, T. Hashimoto, K. Ando, Y. Kato, K. Takemurat, and k. Koyama; "A 0.23$\mu$m$^2$ Double Self–Aligned Contact Cell for Gigabit DRAMs With a Ge–Added Vertical Epitaxial Si Pad"; *IEEE Proceedings*, 1996, pp. 22.1.1–2.1.4.

H. Sayama, S. Shimizu, Y. Nishida, T. Kuroi, Y. Kanada, M. Fujisawa, Y. Inoue and T. Nishimura; "Low Resistance Co–Salicided 0.1 $\mu$m CMOS Technology Using Selective Si Growth"; *IEEE Proceedings*, 1999, pages unreadable.

T. Tanaka, H. Ogawa, K. Goto, K. Itabashi, T. Yamazaki, J. Matsuo, T. Sugii and I. Yamada; "Channel Engineering using B10H14 Ion Implantation for Low Vth and High SCE Immunity of Buried–Channel PMOSFETs in 4–Gbit DRAMs and Beyond"; *IEEE, Proceedings*, 1998, pp. unreadable.

C.–P. Chao, K. E. Violett, S. Unnikrishan, M. Nandakumar, R. L. Wise, J. A. Kittl, Q.–Z. Hong and I.–C. Chen; "Low Resistance Ti or Co Salicided Raised Source/Drain Transistors for Sub–0.13 $\mu$m CMOS Technologies"; *IEEE Proceedings*, 1997, pp. 5.2.1–5.2.4.

Asen Asenov and Subhash Saini, "Suppression of Random Dopant–Induced Threshold Voltage Fluctuations in Sub–0.1–$\mu$m MOSFETs with Epitaxial and $\delta$–Doped Channels"; *IEEE Transactions on Electron Devices*; vol. 46, No. 8, 1999, pp. 1718–1724.

J.H. Lee et al; "High Performance Buried Channel–pFETs Using Elevated Source/Drain Structure with Self–Aligned Epitaxial Silicon Sliver (SESS)"; *Extended Abstracts of the 1999 International Conference on Solid State Devices and Materials*, 1999, pp. 38–39.

* cited by examiner

METHOD FOR CLEANING A SUBSTRATE IN SELECTIVE EPITAXIAL GROWTH PROCESS

BACKGROUND OF THE INVENTION

1. Field of the Invention

The present invention relates generally to a method for fabricating a semiconductor device, and more particularly to a method for cleaning a substrate in a selective epitaxial growth (SEG) process.

2. Description of the Background Art

According to high integration of a semiconductor device, a line width of a circuit pattern has been gradually decreased. In addition, various processes have been developed to obtain excellent device properties. Especially, a number of processes relating to a contact process have been suggested to improve efficiency of the operation.

Although the line width of the pattern is miniaturized, a contact between an upper pattern and a lower pattern may not be stabilized. In the case that a contact resistance is increased between the upper pattern and the lower pattern, a high-speed operation cannot be achieved. There are therefore increasing demands for a new contact process. Here, a representative example of the new contact processes is a self aligned contact (SAC) process which has been applied to fabrication of a memory device over 256M.

The SAC process will not be explained in detail. However, a semiconductor device using the SAC process obtains a stabilized contact between an upper pattern and a lower pattern, but does not restrict increase of contact resistance of the patterns.

In general, polysilicon is used as a contact plug material. A silicon substrate and a polysilicon contact plug consist of the same material, and thus a contact resistance is presumed to be low between the silicon substrate and the polysilicon contact plug in a preferable contact interface state. However, the contact resistance is very high between the silicon substrate and the polysilicon contact plug because a natural oxide film formed on the silicon substrate and residues are positioned between the silicon substrate and the polysilicon contact plug in the contact process.

On the other hand, it is possible to restrict increase of the contact resistance by depositing polysilicon for a contact plug directly after forming a contact hole according to a wet etching process. However, in a state where the size of the contact hole is considerably decreased, the contact resistance is still increased due to a reduced contact area.

In order to restrict increase of the contact resistance resulting from the reduced contact area, a method for using a silicon epitaxial layer as a contact plug has been disclosed according to an SEG process. The SEG process has been applied to various fields, such as shallow junction formation, element isolation process and contact plug formation.

So as to form a silicon epitaxial layer contact plug according to the SEG process, the surface of the silicon substrate should be cleaned before growing the silicon epitaxial layer. The surface state of the silicon substrate before the growth of the silicon epitaxial layer is operated as a main vector deciding a physical property of the silicon epitaxial layer.

Accordingly, in the SEG process, the surface of the silicon substrate is cleaned in situ in a chamber before growing the silicon epitaxial layer. Exemplary in-situ surface cleaning processes include a bake process using a cleaning gas such as $H_2$, HCl and $Cl_2$, and a vacuum thermal treatment. The $H_2$ bake process is generally used.

However, the cleaning process of the silicon substrate is required to be performed at a high temperature over 750° C., which makes it difficult to obtain good device properties.

In more detail, the cleaning process of the silicon substrate requires the highest temperature in the SEG process, generally a temperature over 800° C. Even an ultrahigh vacuum chemical vapor deposition process using the lowest temperature among the SEG processes requires a high temperature over 750° C. When a high temperature process is performed over 750° C., the surface of the substrate is stably cleaned, but the doping density of a junction region is varied to deteriorate the device property. Thus, the conventional in-situ surface cleaning process requires a process temperature over 750° C., thereby rendering it difficult to improve the device properties.

On the other hand, deterioration of the device property due to the cleaning process can be prevented by lowering the process temperature. However, the surface of the silicon substrate is cleaned according to a chemical reaction, and therefore cleaning efficiency is sharply reduced at a temperature below 750° C. Moreover, the cleaning time is increased exponentially as temperature decreases.

SUMMARY OF THE INVENTION

Accordingly, it is an object of the present invention to provide a method for cleaning a substrate in a selective epitaxial growth process which can lower substrate temperature, preventing deterioration of a device property.

Another object of the present invention is to provide a method for cleaning a substrate in a selective epitaxial growth process which can prevent a device property from being deteriorated due to a substrate cleaning process.

In order to achieve the above-described objects of the present invention, there is provided a method for cleaning a substrate in a selective epitaxial growth process wherein a high temperature heating element is aligned in a silicon epitaxial layer growth chamber, separately from the substrate, a cleaning gas inserted into the chamber is decomposed in an atom or radical state having high reactivity in a gas phase according to heat generation of the high temperature heating element, and diffused into the substrate, and a substrate cleaning reaction is performed at a substrate temperature ranging from 400 to 600° C.

The high temperature heating element is formed in a filament shape, and consists of a heat resistance metal such as tungsten or tantalum, precious metal material, or nonmetal material such as SiC or graphite. Here, the high temperature heating element generates heat at a temperature ranging from 1000 to 2000° C., and is aligned separately from the substrate by 1 to 10 cm.

The cleaning gas is selected from the group consisting of $H_2$, HCl and $Cl_2$. In the substrate cleaning reaction, a pressure is adjusted between 0.1 and 100 mTorr.

BRIEF DESCRIPTION OF THE DRAWINGS

The present invention will become better understood with reference to the accompanying drawings which are given only by way of illustration and do not limit the present invention, wherein.

DETAILED DESCRIPTION OF THE PREFERRED EMBODIMENTS

A method for cleaning a substrate in a selective epitaxial growth (SEG) process in accordance with a preferred embodiment of the present invention will now be described in detail with reference to the accompanying drawings.

Figure 1:
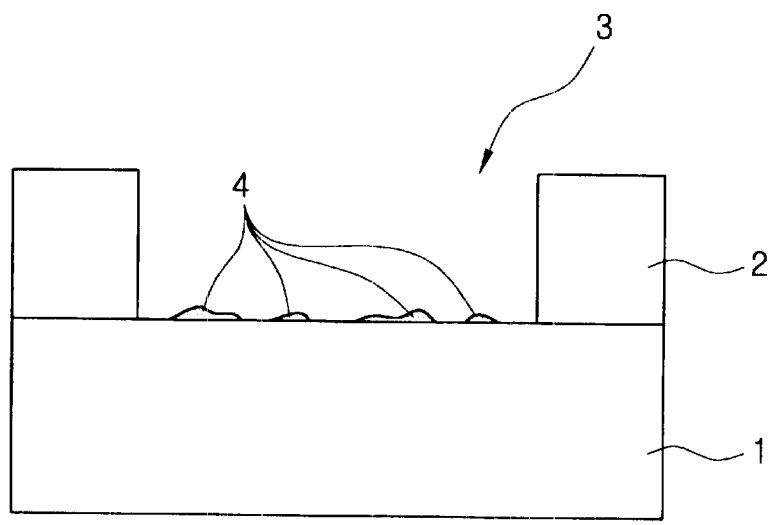
FIG. 1 shows a known state where residue is generated on a surface of a substrate where a silicon epitaxial layer will be grown.

Referring to FIG. 1, in a process for forming a contact plug, a natural oxide film or residue 4 such as carbon exist on the surface of a substrate 1 exposed by a contact hole 3, contact hole 3 being formed within an insulating film 2. Here, when a silicon epitaxial layer (not shown) is grown on the substrate 1 according to the SEG process, the residue 4 remains between the substrate 1 and the silicon epitaxial layer, and therefore contact resistance is increased between the substrate 1 and the contact plug consisting of the silicon epitaxial layer.

Accordingly, in the SEG process, known dry and wet cleaning processes are performed to remove the residue from the surface of the substrate before growing the silicon epitaxial layer. In addition, an in-situ substrate cleaning process, namely a bake process is carried out in a silicon epitaxial layer growth chamber to completely remove the residue just before growing the silicon epitaxial layer. Especially, the in-situ substrate cleaning process is operated as an important vector deciding a physical property of the silicon epitaxial layer.

The present invention relates to the in-situ substrate cleaning process. Here, the substrate is cleaned according to thermal decomposition using a substrate temperature below 750° C., preferably temperature ranging from 400 to 600° C.

Figure 2:
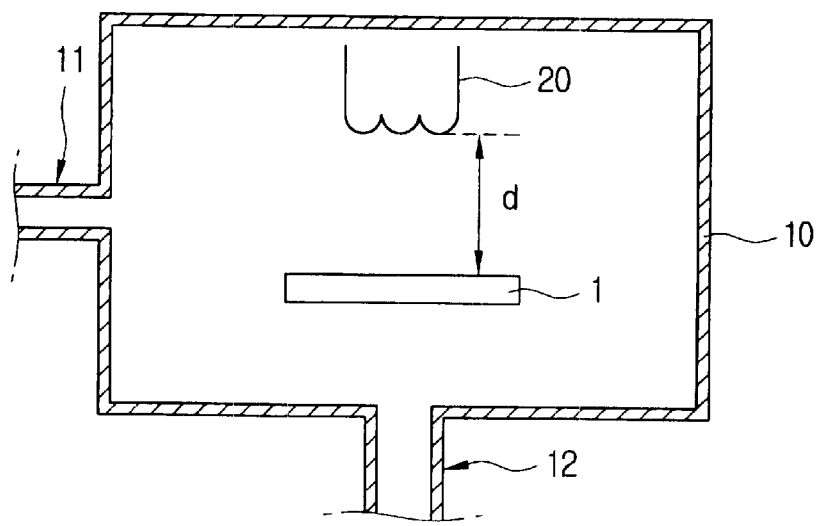
FIG. 2 shows a method for cleaning a substrate in accordance with a preferred embodiment of the present invention.

FIG. 2 shows the method for cleaning the substrate in accordance with the preferred embodiment of the present invention. Reference numeral 1 denotes a silicon substrate having a contact hole, similar to the contact hole of FIG. 1, 10 denotes a silicon epitaxial layer growth chamber, 11 denotes a cleaning gas inlet, and 20 denotes a high temperature heating element.

As illustrated in FIG. 2, the silicon substrate 1 is positioned at the lower center portion of the chamber 10, and a hot wire, namely the high temperature heating element 20 is aligned at the upper center portion of the chamber 10, separately from the silicon substrate 1 by a predetermined distance (d). The cleaning gas inlet 11 is provided at one side portion of the chamber 10, and a gas outlet 12 is positioned at the lower side portion of the chamber 10.

Preferably, the high temperature heating element 20 is formed in a filament shape, and consists of a heat resistance metal such as tungsten or tantalum, precious metal material, or non-metal material such as SiC or graphite.

The method for cleaning the substrate by using the high temperature heating element 20 will now be explained. First, the silicon substrate 1 is loaded in the chamber 10. After the pretreatment and the wet cleaning process, the high temperature heating element 20 is heated at a temperature over 1000° C., preferably to a temperature ranging from 1000 to 2000° C. At this time, the cleaning gas, such as $H_2$, HCl and $Cl_2$, inserted through the gas inlet 11 is decomposed in an atom or radical state having high reactivity in a gas phase of the high temperature heating element 20, and is diffused from the high temperature heating element 20 to the silicon substrate 1. This causes the cleaning reaction to be activated on the surface of the substrate 1. The decomposition and diffusion of the gas by the high temperature heating element is described by 'S. M. Celik and M. C. Ozturk, J. Electrochem. Soc., Vol. 145, p. 3602 (1998)'.

Although the high temperature heating element 20 is heated at a temperature over 1000° C., the residue is completely removed from the surface of the substrate 1 at a substrate temperature lower than the conventional substrate temperature of 750° C., namely at a temperature ranging from 400 to 600° C. due to activation of the cleaning reaction on the substrate 1.

In addition, when the amount of atoms and radicals of the cleaning gas diffused into the silicon substrate 1 is increased, the cleaning reaction is more activated to lower the substrate temperature. Here, the amount of atoms and radicals of the cleaning gas can be further controlled by adjusting the cleaning gas flow rate, the process pressure and the distance between the silicon substrate 1 and the high temperature heating element 20.

In this embodiment, the high temperature heating element 20 is separated from the silicon substrate 1 by a distance (d) in a range of from 1 to 10 cm, the cleaning gas flow rate is appropriately adjusted, and the process pressure ranges from 0.1 to 100 mTorr.

As discussed earlier, the method for cleaning the substrate in accordance with the present invention lowers the substrate temperature of the in-situ substrate cleaning process lower than the conventional substrate temperature by using thermal decomposition, instead of using the conventional thermal treatment. However, the device property is not influenced by the reduced temperature. That is, the cleaning process does not deteriorate the device properties.

As a result, the substrate is cleaned according to the thermal decomposition of the cleaning gas by the high temperature heating element, to lower the process temperature and reduce the process time. The residue is completely removed from the substrate even at a low temperature, thus improving the device property. Accordingly, the present invention is suitable for fabrication of high integration devices.

Moreover, the cleaning reaction is remarkably activated according to the thermal decomposition using the high temperature heating element, and thus the substrate temperature is lowered to a suitable range of from 400 to 600° C. Therefore, the substrate cleaning process does not deteriorate the device properties.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalents thereof are intended to be embraced by the appended claims.

What is claimed is:

1. A method for cleaning a substrate in a selective epitaxial growth process, the method comprising:

aligning a high temperature heating element disposed separated from the substrate in a silicon epitaxial layer growth chamber;

generating heat by the heating element;

flowing a cleaning gas into the chamber;

decomposing the cleaning gas in an atom or radical state having high reactivity in a gas phase as a result of the heat generated by high temperature heating element;

diffusing the decomposed cleaning gas in into the substrate to perform a substrate cleaning reaction: and maintaining the temperature of the substrate during the substrate cleaning reaction in a range from 400 to 600°.

2. The method according to claim 1, wherein said high temperature heating element is formed in a filament shape.

3. The method according to claim 1, wherein said high temperature heating element comprises a heat resistance metal or precious metal material.

4. The method according to claim 3, wherein said heat resistance metal is tungsten or tantalum.

5. The method according to claim 1, wherein said high temperature heating element comprises a non-metal material.

6. The method according to claim 5, wherein said non-metal material is chosen from a group consisting of SiC and graphite.

7. The method according to claim 1, wherein the high temperature heating element generates heat at a temperature ranging from 1000 to 2000° C.

8. The method according to claim 1, wherein the high temperature heating element is aligned separated from the substrate by a distance in a range of from 1 to 10 cm.

9. The method according to claim 1, wherein said cleaning gas is selected from the group consisting of $H_2$, HCl and $Cl_2$.

10. The method according to claim 1, wherein the gas pressure is adjusted between 0.1 and 100 mTorr in the substrate cleaning reaction.

* * * * *